(12) United States Patent
Appleton et al.

(10) Patent No.: US 9,979,369 B2
(45) Date of Patent: May 22, 2018

(54) AUDIO PEAK LIMITING

(71) Applicant: Dolby Laboratories Licensing Corporation, San Francisco, CA (US)

(72) Inventors: Nicholas Luke Appleton, Bellevue Hill (AU); Christopher Mark Tubb, Berowra (AU); William Thomas Rowley, Glebe (AU); Imankalyan Mukherjee, Stanmore (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days. days.

(21) Appl. No.: 15/788,443

(22) Filed: Oct. 19, 2017

(65) Prior Publication Data

US 2018/0115292 A1 Apr. 26, 2018

Related U.S. Application Data

(60) Provisional application No. 62/410,903, filed on Oct. 21, 2016.

(51) Int. Cl.
*H03G 3/00* (2006.01)
*H03G 11/04* (2006.01)
*H03G 3/20* (2006.01)

(52) U.S. Cl.
CPC ............... *H03G 11/04* (2013.01); *H03G 3/20* (2013.01)

(58) Field of Classification Search
USPC ........ 381/104, 106, 107, 110, 321, 58, 94.8, 381/55, 57
See application file for complete search history.

(56) References Cited

U.S. PATENT DOCUMENTS

| | | | |
|---|---|---|---|
| 8,488,811 B2 | 7/2013 | Smithers et al. | |
| 2009/0271185 A1* | 10/2009 | Smithers ............... | H03G 7/007 704/225 |
| 2014/0114654 A1* | 4/2014 | Brajbhushan ......... | G10L 21/034 704/225 |

* cited by examiner

*Primary Examiner* — Yosef K Lakemariam

(57) ABSTRACT

An audio peak limiter apparatus which calculates a smoothed sequence of gains for application to a sequence of blocks of samples of an audio signal. The apparatus sometimes calculates a candidate gain, to replace a too-large smoothed gain, such that applying the candidate gain would produce no scaled sample whose magnitude exceeds a predetermined limit. The apparatus sometimes calculates and stores a final gain to replace the too-large smoothed gain (where the final gain can be obtained e.g. by dividing the to-be-replaced smoothed gain by a prior smoothed gain and multiplying the result by the corresponding prior final gain), if it is determined that the candidate gain is not less than the immediately previous final gain.

10 Claims, 2 Drawing Sheets

US 9,979,369 B2

AUDIO PEAK LIMITING

TECHNICAL FIELD

The present disclosure relates generally to audio peak limiting, and more specifically to audio peak limiting based on both smoothed and instantaneous gains.

BACKGROUND

Audio peak limiting has been a fundamental part of the production, transmission and reproduction of audio for over 50 years. For example, if multiple digital audio signals are mixed in the digital domain without scaling, during playback it is possible for the sum of the audio data to exceed the maximum digital signal that can be represented during the digital-to-analog conversion. The result is a clipped output analog waveform, which audio peak limiting aims to avoid.

Audio peak limiting is discussed in U.S. Pat. No. 8,488,811 B2, the "'811 patent", the entire contents of which are hereby incorporated by reference. The '811 patent discloses a two-stage audio peak limiter which includes a slow-gain reducer and a fast-gain reducer. The slow-gain reducer receives an audio signal, calculates a slow gain and multiplies the audio signal by the slow gain to produce an intermediate audio signal. The fast-gain reducer receives and buffers the intermediate audio signal, performs peak detection on the buffered intermediate audio signal, uses the output of the peak detection to calculate a fast gain, and multiplies the buffered intermediate audio signal the by the fast gain to produce an output audio signal. Broadly speaking, the slow gain can change only slowly in order to avoid sudden changes in loudness in the final rendering of the audio signal, and the fast gain acts as a kind of backup or failsafe to quickly change the total gain applied to the audio signal when necessary to avoid clipping as a result of the slow gain not changing quickly enough to deal with a high signal peak.

The length of the buffer in the audio peak limiter is an important design parameter. Too long, and the latency introduced by the audio peak limiter becomes too high. Too short, and the gain applied by the audio peak limiter will not be smoothed to a sufficient extent, particularly if the audio signal includes significant low-frequency components (e.g., sustained bass).

BRIEF DESCRIPTION OF DRAWINGS

Example embodiments will be described below with reference to the accompanying drawings, in which.

All the Figures are schematic and generally show only parts which are necessary in order to elucidate the present disclosure, whereas other parts may be omitted or merely suggested. Unless otherwise indicated, like reference numerals refer to like parts in different Figures.

DESCRIPTION OF EXAMPLE EMBODIMENTS

A. Overview

Generally speaking, disclosed herein is an audio peak limiter apparatus which calculates a smoothed sequence of gains for application to a sequence of blocks of (buffered) samples of an audio signal. The apparatus sometimes calculates a replacement gain, to replace a too-large smoothed gain, which is small enough to ensure that none of the resulting scaled samples exceeds a desired limit. If the gain value required to achieve this is smaller than the gain value that was applied to the previous block of samples, then the audio peak limiter is said to be on attack. Conversely, if the gain value required to achieve this is larger than the gain value that was applied to the previous block of samples, then the audio peak limiter is said to be on release. In an embodiment, the replacement gain is implemented immediately or nearly immediately (resembling a step change) when on attack, and gradual (albeit fast relative to the smoothed gain) when on release. The gradual release characteristic is achieved by determining applied-gain-divided-by-smoothed gain, for one or more previous blocks of samples, and using (the lowest one of) the result(s), released through a smoothing filter, to calculate the gain to be applied to a current block of samples. This "history of ratios" enables abrupt changes of gain value to be smoothed, when the audio peak limiter is on release, over of a longer period of the audio signal than is covered by the block of samples. Consequently, the audio peak limiter's buffer can be kept relatively small, but the gain applied by the audio peak limiter will still be smoothed to a sufficient extent.

B. Example Embodiment

I. Post Processing Chain

Figure 1:
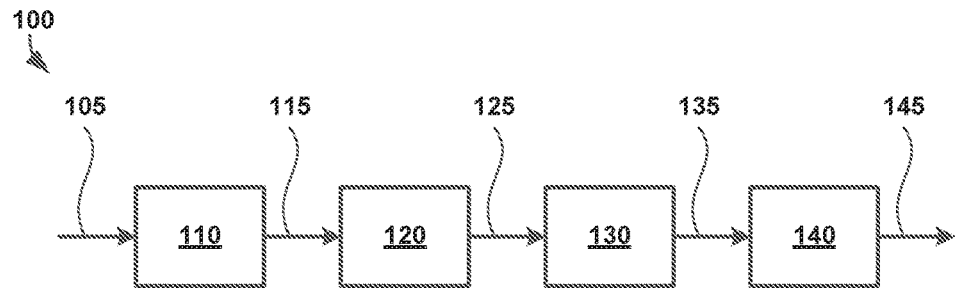
FIG. 1 is a block diagram which schematically illustrates an audio post-processing chain according to an embodiment of the present disclosure.

Referring to FIG. 1, a post processing chain 100 according to an embodiment comprises four processing modules. The four processing modules are a Volume Levelling and DRC module 110, an Audio Optimiser module 120, an Audio Regulator module 130 and an Audio Peak Limiter module 140. The Audio Peak Limiter module 140 is the final module in the post processing chain 100.

The Volume Levelling and Dynamic Range Control (DRC) module 110 receives audio data 105 in the form of a stream of pulse code modulation (PCM) encoded samples of an audio signal, sampled at a rate of 48 kHz. The Audio Optimiser module 120 receives processed audio data 115 from the Volume Levelling and DRC module 110. The processed audio data 115 may be in a time-domain representation or a frequency-domain representation, depending on the specific implementation. The Audio Regulator module 130 receives processed audio data 125 from the Audio Optimiser module 120. Again, the processed audio data 125 may be in a time-domain representation or a frequency-domain representation, depending on the specific implementation. The Audio Peak Limiter module 140 receives processed audio data 135 from the Audio Regulator module 130. In the present embodiment, the processed audio data 135 is in a time-domain representation. The processed audio data 135 (and perhaps any one or more of the audio data 105, the processed audio data 115 and the processed audio data 125) may include peaks which exceed a desired limit and so may benefit from audio peak limiting.

In the post processing chain 100 according to the present embodiment, the Audio Peak Limiter module 140 is novel and will be described in detail below, in subsection III.

In the post processing chain 100 according to the present embodiment, the Volume Levelling and DRC module 110, the Audio Optimiser module 120, and the Audio Regulator module 130 are implemented in a conventional manner, for which multiple implementation options will be apparent to a person of ordinary skill in the art. For example, the Dolby Audio set of technologies implemented in the Microsoft Edge web browser includes suitable implementations of these modules.

It will be appreciated that the post processing chain 100 is one of many possible examples of a post processing chain which may include the novel Audio Peak Limiter module 140.

II. Example Implementation Architecture

In various embodiments, the post processing chain 100 and the associated techniques described herein are implemented by one or more apparatuses, such as one or more special-purpose computing devices. In at least one embodiment, one or more such special-purpose computing devices may be connected together and/or to other computing devices.

Figure 2:
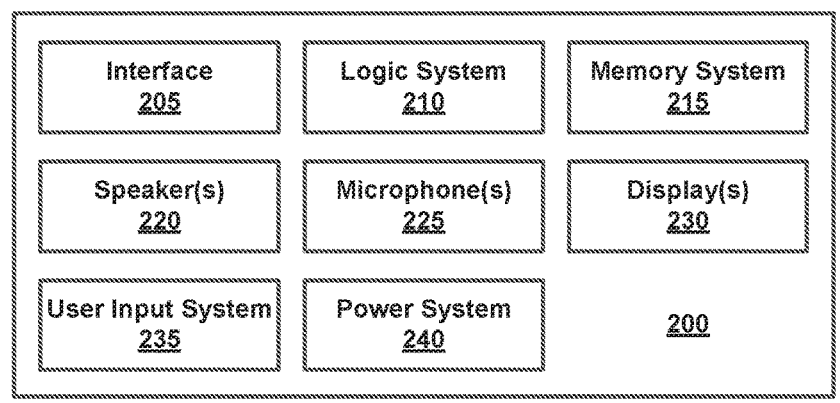
FIG. 2 is a block diagram which schematically illustrates an apparatus suitable for implementing part or all of the audio post-processing chain shown in FIG. 1.

FIG. 2 is a block diagram that shows examples of components of such a special-purpose computing device 200. In this example, the computing device 200 includes an interface system 205. The interface system 205 may include a network interface, such as a wireless network interface. Alternatively, or additionally, the interface system 205 may include a universal serial bus (USB) interface or another such interface.

The device 200 includes a logic system 210. The logic system 210 may include a processor, such as a general purpose single- or multi-chip processor. The logic system 210 may include a digital signal processor (DSP), an application specific integrated circuit (ASIC), a field programmable gate array (FPGA) or other programmable logic device, discrete gate or transistor logic, or discrete hardware components, or combinations thereof. The logic system 210 may be configured to control the other components of the device 200. Although no interfaces between the components of the device 200 are shown in FIG. 2, the logic system 210 may be configured with interfaces for communication with the other components. The other components may or may not be configured for communication with one another, as appropriate.

The logic system 210 may be configured to perform audio peak limiting functionality, including but not limited to the techniques described herein. In some such implementations, the logic system 210 may be configured to operate (at least in part) according to software, such as a computer program, stored one or more non-transitory media. The non-transitory media may include memory associated with the logic system 210, such as random access memory (RAM) and/or read-only memory (ROM). The non-transitory media may include memory of a memory system 215. The memory system 215 may include one or more suitable types of non-transitory storage media, such as flash memory, a hard drive, etc.

The display system 230 may include one or more suitable types of display, depending on the manifestation of the computing device 200. For example, the display system 230 may include a liquid crystal display, a plasma display, a bistable display, etc.

The user input system 235 may include one or more devices configured to accept input from a user. In some implementations, the user input system 235 may include a touch screen that overlays a display of the display system 230. The user input system 235 may include a mouse, a track ball, a gesture detection system, a joystick, one or more GUIs and/or menus presented on the display system 230, buttons, a keyboard, switches, etc. In some implementations, the user input system 235 may include the microphone 225: a user may provide voice commands for the device 200 via the microphone 225. The logic system may be configured for speech recognition and for controlling at least some operations of the device 200 according to such voice commands.

The power system 240 may include one or more suitable energy storage devices, such as a nickel-cadmium battery or a lithium-ion battery. The power system 240 may be configured to receive power from an electrical outlet.

III. Audio Peak Limiting

The logic system 210 is configured to implement the Audio Peak Limiter module 140.

The purpose of the Audio Peak Limiter module 140 is to appropriately scale the processed audio data 135, using one or more gains, in order to avoid a maximum value (typically, a desired limit) being exceeded by any of the processed audio data 135.

Figure 3:
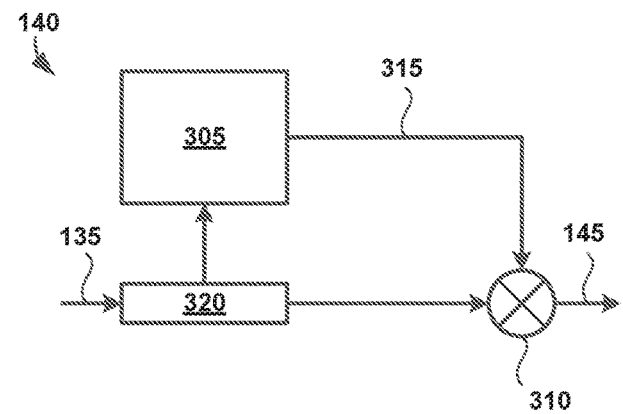
FIG. 3 is a block diagram which schematically illustrates in more detail a novel part of the audio post-processing chain shown in FIG. 1.

Referring to FIG. 3, the Audio Peak Limiter module 140 according to the present embodiment comprises three modules. The three modules are a Gain Calculator module 305, a Gain Application module 310 and a Delay module 320.

In the present embodiment, the Delay module 320 receives a stream of samples of the processed audio data 135, and buffers a block of N of the samples (N=64 in the present embodiment) using the memory system 215. The block of samples represents a temporal segment of an audio signal, which in the present embodiment is approximately 1.33 milliseconds.

The Gain Calculator module 305 receives a sequence of blocks of samples from the Delay module 320, and outputs a suitably-synchronised sequence of gains 315 suitable for application to the sequence of blocks of samples, and whose values are dependent inter alia on the respective blocks of samples.

The Gain Application module 310 also receives the sequence of blocks of samples from the Delay module 320, as well as the stream of gains 315 from the Gain Calculator module 305, and multiplies one by the other in order to produce the processed audio data 145 (i.e., the output of the Audio Peak Limiter module 140 shown in FIG. 1). Like the Gain Calculator module 320, the Gain Application module 310 receives the sequence of blocks of samples of the processed audio data 135.

Figure 4:
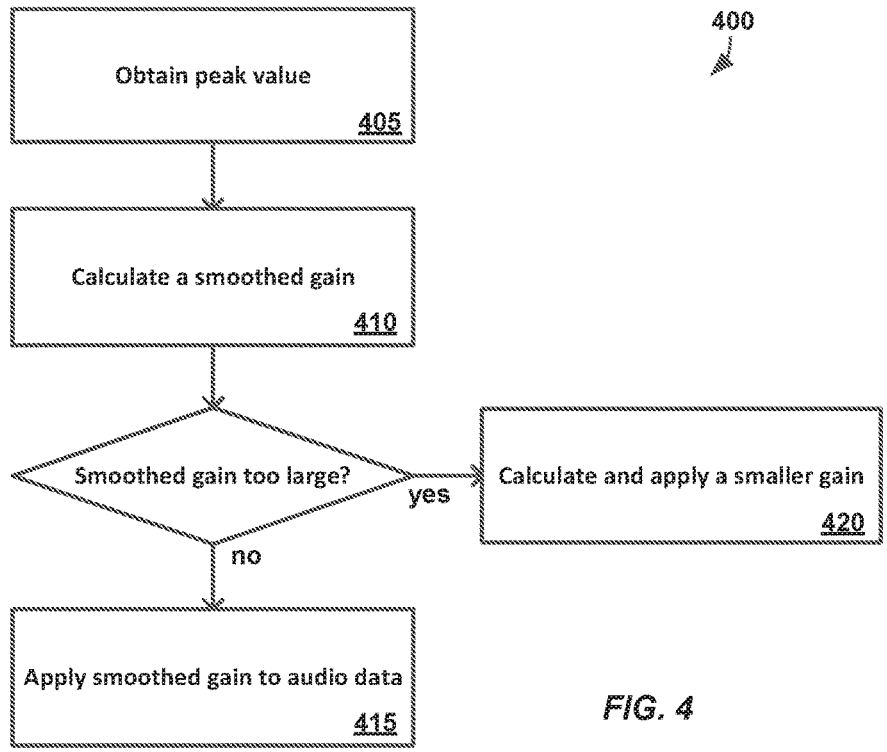
FIG. 4 is a flow chart which schematically illustrates some example main steps of an audio peak limiting method performed by the novel part shown in FIG. 3.

Together, the Gain Calculator module 305 and the Gain Application module 310 are configured to carry out a method 400 of performing audio peak limiting, as schematically illustrated in FIG. 4. In overview, the method 400 involves calculating a smoothed sequence of gains for application to the sequence of blocks of samples, and sometimes taking action to substitute a smoothed gain by a smaller gain, in a way that does not introduce too many artefacts in the processed audio data 145.

In the present embodiment, the method 400 comprises a pre-step (not shown in FIG. 4) of calculating a peak value of a current block of samples of the processed audio data 135. Various suitable techniques for calculating the peak value will be readily apparent to a person of ordinary skill in the art. For example, the peak value can be calculated in the manner described in the '811 patent, in the subsection entitled Finding Peak Samples, which bridges columns 10 and 11 of the '811 patent.

The method 400 comprises, in a first step 405, accessing the peak value of the block of samples, and, in a second step 410, calculating a smoothed gain based on the peak value and a given limit (which in the present embodiment is a system parameter).

It is desirable that, where possible, the respective gains applied to successive blocks of the processed audio data 135 change relatively gradually (if they change at all). This is the primary reason for implementing the smoothed gain. The smoothed gain will generally correspond to the extent to which the magnitude of the peak value of the current block of samples differs from the magnitude of the given limit, whilst complying with one or more constraints (typically, an attack time constant and a release time constant) suitable for ensuring that respective gains applied to successive blocks of the processed audio data 135 change relatively gradually (if they change at all). Various suitable techniques for calculating the smoothed gain, perhaps based on low-pass filtering or another smoothing function, will be readily apparent to a person of ordinary skill in the art.

The method 400 comprises, in a third step 415, applying the smoothed gain to the current block of samples if the magnitude of the product of the peak value and the smoothed gain is not larger than the given limit. In other words, it will be the smoothed gain which is applied to the current block of samples, unless the smoothed gain is too large. After all, the Audio Peak Limiter module 140 should scale the block of samples such that none of them is higher than the given limit (i.e., the total gain it applies needs to be small enough to achieve this).

The method 400 therefore comprises, in step 420, calculating and applying a smaller gain (with respect to the smoothed gain) if the product of the peak value and the smoothed gain is larger than the given limit. In the novel Audio Peak Limiter module 140 according to the present embodiment, the Gain Calculator module 305 calculates the smaller gain using an algorithm, Algorithm 1, generally as described in the pseudocode algorithm shown in Table 1.

Figure 5:
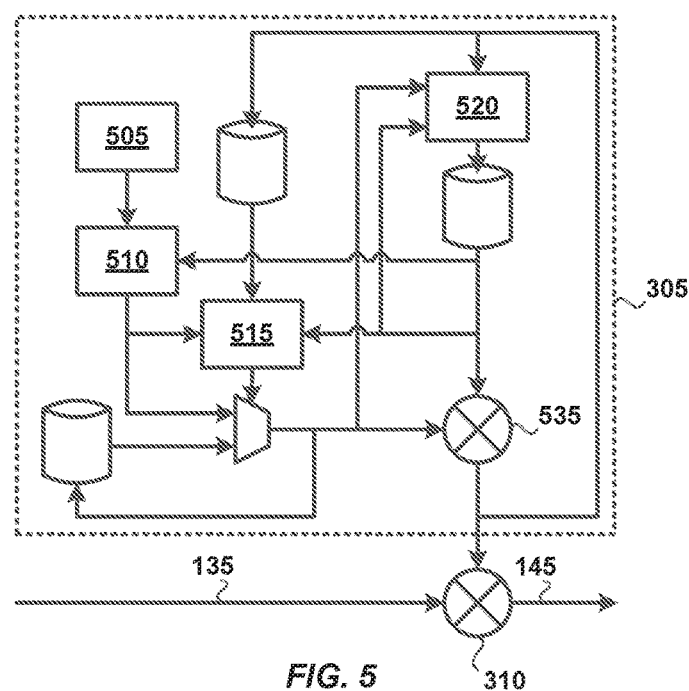
FIG. 5 is a data flow diagram which schematically illustrates some of the main calculations performed as part of one of the steps shown in FIG. 4 (see also Algorithm 1, hereinbelow).

With reference to FIG. 5, the implementation of Algorithm 1 by the Gain Calculation module 305 can be summarised as follows.

According to line 1 of Algorithm 1, the buffer 320 is accessed to obtain the block of samples, and the absolute maximum value across all of the samples is calculated 505. It is noted here that the block of samples may represent (a temporal segment of) a multi-channel audio signal, e.g. a stereo audio signal, a 5.1 channel audio signal, a 7.1 channel audio signal, or the like, in which case the calculated absolute maximum value is the absolute maximum value across all of the samples across all of the channels.

According to lines 2-6 of Algorithm 1, an intermediate gain factor is calculated 510, which is either a unity gain or a "correction factor" less than 1. The correction factor is such that multiplying it by the previous smoothed gain (retrieved from the memory system 215, in the present embodiment) results in a total gain which, when applied to the block of samples, scales the absolute maximum sample value to be substantially equal to the given limit.

According to lines 7-13 of Algorithm 1, a selection 515 is made whereby either the calculated intermediate gain factor is selected or a smaller, previous intermediate gain factor (retrieved from the memory system 215, in the present embodiment) is selected. The selection 515 is made based on a comparison with the final gain 315 (retrieved from the memory system 215, in the present embodiment) applied to the previous block of samples, to determine whether the gain is on attack or on release. More specifically, if said final gain 315 is greater than the product of the calculated intermediate gain factor and the retrieved smoothed gain (in which case the gain is deemed to be on attack), then it is the intermediate gain factor which is selected 515. Otherwise (in which case the gain is deemed to be on release), it is said previous intermediate gain factor which is selected 515, which is released through a first order filter (not shown). Thus, the intermediate gain factor, in the present embodiment, has an instantaneous attack and a release which is determined by the first order filter.

According to line 14 of Algorithm 1, the selected intermediate gain factor is multiplied 535 by the retrieved smoothed gain, to obtain thereby the gain 315 which is to be applied to the block of samples.

According to lines 15-18 of Algorithm 1, the retrieved smoothed gain is updated 520 based on a comparison of the selected intermediate gain factor with a predetermined limit. If the selected intermediate gain factor is less than a tuneable threshold ("SLOW_GAIN_THRESH") then the retrieved smoothed gain is deemed to be on attack and so is decreased 520 by a decrement according to a predetermined attack time constant, before being stored back to memory. If the selected intermediate gain factor is greater than or equal to the threshold then the retrieved smoothed gain is deemed to be on release and so is increased 520 by an increment according to a predetermined release time constant, before being stored back to memory.

According to lines 19 and 20 of Algorithm 1, the selected intermediate gain factor, the gain 315 and the updated smoothed gain are stored to memory, in connection with one another (so that it can be determined that each of the values corresponds to one and the same block of samples), for use with the next block of samples.

In the present embodiment, the applied gain 315 increases towards unity, across the samples of the current block, according to a predetermined time constant.

TABLE 1

Gain Calculator Algorithm

Tuning parameters:

limit represents a requested maximum signal level
SLOW_GAIN_THRESH determines whether the slow_gain is on attack or on release
FAST_GAIN_RELEASE_TIME_CONSTANT determines the gradient of the increase in fast_gain towards 1
SLOW_GAIN_ATTACK_TIME_CONSTANT determines the gradient of the decrease in slow_gain towards a level calculator to avoid living
SLOW_GAIN_RELEASE_TIME_CONSTANT determines the gradient of the increase in slow_gain towards 1
N.B. when the Gain Calculator Algorithm is initialised, the slow_gain variable is set to 1
1. calculate the absolute maximum sample (abs_max) of the current and the previous block of samples
2. scaled_max = abs_max * slow_gain
3. if scaled_max > limit {
4.     inst_fast_gain = limit / scaled_max }
5. else {
6.     inst_fast_gain = 1 }
7. new_total_gain = inst_fast_gain * slow_gain
8. if new_total_gain < previous_total_gain {
9.     fast_gain = inst_fast_gain }
10. else {

TABLE 1-continued

Gain Calculator Algorithm 11. set held_gain to min. inst_fast_gain from this block and the previous M blocks, where M is an integer ≥ 1
12. set fast_gain to the output of a first order smoothing filter according to FAST_GAIN_RELEASE_TIME_CONSTANT and with held_gain as the input }
13. total_gain = fast gain * slow_gain
14. if fast_gain < SLOW_GAIN_THRESH {
15. decrease slow_gain using a first order smoothing filter with SLOW_GAIN_ATTACK_TIME_CONSTANT }
16. else {
17. increase slow_gain using a first order smoothing filter with SLOW_GAIN_RELEASE_TIME_CONSTANT }
18. store total_gain as previous_total_gain for the next block
19. store fast_gain and slow_gain for the next block

C. Equivalents, Alternatives & Miscellaneous

Further embodiments of the present disclosure will become apparent to a person skilled in the art after studying the description above.

For example, the sequence of smoothed gains can be calculated in the manner described for the slow gain in the '811 patent, in the subsection entitled Calculating the Slow Gain, which runs from the top of column 7 to partway down column 10 of the '811 patent.

For example, the instantaneous gain can be calculated in the manner described for the fast gain in the '811 patent, in the subsection entitled Calculating Fast Gain, which runs from about two thirds of the way down column 11 to near the bottom of column 13 of the '811 patent. A simpler technique, which may be suitable in some implementations, is to set the instantaneous gain to the value which results from dividing the magnitude of the given limit by the magnitude of the peak value of the current block of samples, or a slightly smaller value.

In the embodiment described above, if the gain 315 changes at the transition from one block of samples to the next, a smooth change is achieved using cross fading (over a period which has the same duration as each of the blocks of samples; other suitable cross-fading periods will be readily apparent to a person of ordinary skill in the art). In an alternative embodiment, the cross fading is omitted and line 1 of Algorithm 1 calculates the absolute maximum value across all of the samples of just the current block (i.e., without considering any sample of the previous block).

In the embodiment described above, calculating a final gain to be applied to a current block of samples comprises multiplying a current smoothed gain by a prior intermediate value. More specifically, in the embodiment described above, line 2 of Algorithm 1 incorporates scaled_max into its calculation of inst_fast_gain, and then multiplies inst_fast_gain and fast_gain by slow_gain in lines 8 and 13, respectively. In an alternative embodiment, abs_max (instead of scaled_max) is used to calculate inst_fast_gain, and then the steps of multiplying inst_fast_gain and fast_gain by slow_gain to calculate new_total_gain and total_gain, respectively, are omitted.

In the embodiment described above, the time period covered by each of the blocks is 1.33 milliseconds (64 samples at 48 kHz sampling rate). In other embodiments, the time period covered by each of the blocks may be higher, e.g. 2.66 milliseconds (128 samples at 48 kHz sampling rate), or lower, e.g. 0.66 milliseconds (32 samples at 48 kHz sampling rate). The inventors have observed that with a time period of around 5 milliseconds, or less, certain signal components (such as sustained bass) may lead to audible artefacts in an audio signal produced by audio peak limiting processing. If the time period is lower still, say 0.66 milliseconds (which would not be unusual), then the occurrence and severity of the artefacts may be worse still.

In the embodiment described above, the values of SLOW_GAIN_ATTACK, SLOW_GAIN_RELEASE and FAST_GAIN_RELEASE are set to 40 milliseconds, 160 milliseconds and 5 milliseconds, respectively. In other embodiments, different values of SLOW_GAIN_ATTACK, SLOW_GAIN_RELEASE and FAST_GAIN_RELEASE may be set. A person of ordinary skill in the art will appreciate that these are "tuning parameters" which can be varied, while carrying out standard listening tests, to achieve a desired level of performance.

In the foregoing description, obtaining a peak value 405, calculating a smoothed gain 410, determining whether the smoothed gain is too large and, if the smoothed gain is not large, applying the smoothed gain to the audio data, all are presented as being separate from the step of calculating and applying a smaller gain 420, which is the case in various embodiments. In other embodiments, one or more of obtaining a peak value; calculating a smoothed gain; determining whether the smoothed gain is too large; and, if the smoothed gain is not large, applying the smoothed gain to the audio data, may be shared with calculating and applying a smaller gain. For example, lines 1, 2 and 3 of Algorithm 1 involve obtaining a peak value, calculating a smoothed gain and determining whether the smoothed gain is too large. And line 6 of Algorithm 1 involves setting the variable fast gain to a value of 1, which can have the effect of applying the smoothed gain to the audio data.

In the embodiment described above, the smaller, previous intermediate gain value is the intermediate gain value that was calculated for the immediately previous block of samples. In said embodiment (in which line 1 of Algorithm 1 considers the previous block of samples as well as the current block of samples), "looking back" only one block of samples was found to suffice. In other embodiments, the smaller, previous intermediate gain value is selected as a consequence of being the smallest-valued one of the respective intermediate gain values calculated for multiple previous blocks of samples (which would correspond to the highest smoothed gain (relative to the corresponding final gain) of the multiple previous blocks, and could be obtained retrospectively by dividing said final gain by said smoothed gain). For example, in an embodiment similar to the one described above, but with a block size of 32 samples instead of 64 samples, Algorithm 1 would "look back" at the three previous blocks of samples. As a general rule, this aspect of Algorithm 1 should "look back" far enough to cover more than 5 milliseconds of the audio signal.

In the embodiment described above, two gain values are multiplied together, and the result is applied to a block of samples. In an alternative embodiment, the two gain values are applied to a block of samples separately and in series. For example, the smoothed gain may be applied to the samples before the buffer, and the other gain value may be applied to the same samples after the buffer.

In the embodiment described above, Algorithm 1 is suitable for determining that applying a current one of the smoothed gains to a current one of the blocks of samples would produce at least one scaled sample whose magnitude exceeds a predetermined limit. This is done by determining a maximum value across all of the samples (including all the values from a previous block), multiplying the maximum value by the current one of the smoothed gains and comparing the result with the predetermined limit. In other embodiments, this may be done differently. For example, the smoothed gain may be applied to all of the samples before they are buffered, then a maximum value across all of the buffered samples may be determined and compared with the predetermined limit.

In the embodiment described above, Algorithm 1 is suitable for calculating a candidate gain such that applying the candidate gain to the current block of samples would produce at least one scaled sample whose magnitude is substantially equal to the predetermined limit and no scaled sample whose magnitude exceeds the predetermined limit. This is done by dividing the predetermined limit by the maximum value across all samples of the previous block. In other embodiments, this may be done differently. For example, the maximum value may be compared with several limits, each being higher in value than the last, and then selecting as the candidate value a corresponding one of several values, each being lower than the last.

In the embodiment described above, calculating the current final gain comprises multiplying the current smoothed gain by the intermediate value stored in connection with said prior smoothed gain. In other embodiments, the same current final gain can be obtained in equivalent but different ways. For example, the current final gain may be obtained by dividing the current smoothed gain by a prior smoothed gain and multiplying the result by the final gain stored in connection with said prior smoothed gain. The exact manner in which the current final gain is obtained is considered to be an implementation detail, and various suitable alternatives will be appreciated by a person of ordinary skilled in the art, based on relatively simple arithmetic.

Even though the present description and drawings disclose embodiments and examples, the disclosure is not restricted to these specific examples. Numerous modifications and variations can be made without departing from the scope of the present disclosure, which is defined by the accompanying claims.

Any reference signs appearing in the claims are not to be understood as limiting their scope.

Additionally, variations to the disclosed embodiments can be understood and effected by the skilled person in practicing the disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method in an audio peak limiter apparatus, the apparatus being configured to calculate a smoothed sequence of gains for application to a sequence of blocks of samples of an audio signal, each of the blocks representing a respective temporal segment of the audio signal not greater than 5 milliseconds in duration, the method comprising, in respect of each gain of the sequence:
   determining that applying a current gain of the sequence to a current block of samples would produce at least one scaled sample whose magnitude exceeds a predetermined limit; and
   calculating a candidate gain for replacing said current gain of the sequence, such that applying the candidate gain to the current block of samples would produce at least one scaled sample whose magnitude is substantially equal to the predetermined limit and no scaled sample whose magnitude exceeds the predetermined limit,
   the method being characterised by further comprising, in respect of each gain of the sequence:
   determining that the candidate gain is greater than or equal to the final gain stored in connection with the immediately previous gain of the sequence; and
   calculating a current final gain and storing it in connection with the current gain of the sequence, the current final gain being obtainable by dividing the gain of the sequence by a prior gain of the sequence and multiplying the result by the final gain stored in connection with said prior gain of the sequence.

2. A method according to claim 1 in which, in respect of each gain of the sequence, the prior gain is selected, from the M immediately previous gains of the sequence, as a consequence of being the highest one of those gains relative to the respective final gains stored in connection therewith.

3. A method according to claim 1 in which, in respect of each gain of the sequence, the prior gain is the immediately previous gain of the sequence.

4. A method according to claim 1, comprising, in respect of each gain of the sequence, calculating an intermediate value such that multiplying the intermediate value by the current gain of the sequence would produce a value substantially equal to the candidate value.

5. A method according to claim 4, further comprising, in respect of each gain of the sequence, storing the intermediate value in connection with the current smoothed gain.

6. A method according to claim 5 in which, in respect of each gain of the sequence, calculating the current final gain comprises multiplying the current gain of the sequence by the intermediate value stored in connection with said prior gain.

7. A method according to claim 1, further comprising, in respect of each of the blocks of samples, applying the current final gain to the current block of samples.

8. A method according to claim 7 wherein, in respect of each of the blocks of samples, the applied current final gain increases towards unity, across the samples of the current block, according to a predetermined time constant.

9. An audio peak limiter apparatus comprising:
   an interface for receiving and outputting audio data;
   a memory system for saving audio data and data associated therewith;
   a logic system in communication with the interface and the memory system, the logic system being configured to perform a method in accordance with claim 1.

10. A non-transitory computer readable medium comprising instructions suitable for configuring a logic system of an audio peak limiter apparatus to perform a method in accordance with claim 1.

* * * * *